(12) United States Patent
Nakamura

(10) Patent No.: US 12,396,089 B2
(45) Date of Patent: Aug. 19, 2025

(54) ELECTRONIC DEVICE CAPABLE OF SUPPRESSING HIGH GROUND IMPEDANCE, AND METHOD FOR MANUFACTURING THE ELECTRONIC DEVICE

(71) Applicant: CANON KABUSHIKI KAISHA, Tokyo (JP)

(72) Inventor: Shuichi Nakamura, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 211 days.

(21) Appl. No.: 18/180,392

(22) Filed: Mar. 8, 2023

(65) Prior Publication Data

US 2023/0309214 A1  Sep. 28, 2023

(30) Foreign Application Priority Data

Mar. 28, 2022 (JP) .................. 2022-051124

(51) Int. Cl.
  *H05K 1/02* (2006.01)
  *H05K 1/11* (2006.01)
  *H05K 3/40* (2006.01)
  *H05K 9/00* (2006.01)

(52) U.S. Cl.
  CPC .......... *H05K 1/0224* (2013.01); *H05K 1/115* (2013.01); *H05K 3/4038* (2013.01); *H05K 9/0032* (2013.01); *H05K 2201/10984* (2013.01)

(58) Field of Classification Search
  CPC ....... H05K 1/0224; H05K 2201/10984; H05K 3/3447; H05K 1/0216; H05K 2201/10371
  See application file for complete search history.

(56) References Cited

U.S. PATENT DOCUMENTS

| 5,828,555 A * | 10/1998 | Itoh | H05K 1/0221 439/74 |
|---|---|---|---|
| 7,351,107 B1 * | 4/2008 | Burlock | H01R 13/658 361/752 |
| 2007/0029108 A1 * | 2/2007 | Nakao | H05K 3/3447 174/266 |
| 2009/0016039 A1 * | 1/2009 | Imamura | H05K 3/3405 361/818 |

(Continued)

FOREIGN PATENT DOCUMENTS

JP  3067326 B2  7/2000
JP  2010192756 A  9/2010

*Primary Examiner* — Sherman Ng
(74) *Attorney, Agent, or Firm* — ROSSI, KIMMS & McDOWELL LLP

(57) ABSTRACT

An electronic device that is capable of keeping the impedance (ground impedance) between a printed circuit board and a shield case low. The electronic device includes a printed circuit board that has ground layer(s) which is conductive and is provided at a location in the thickness direction of the printed circuit board, and the shield case which is disposed on one side of the printed circuit board and consists of a hollow body that has conductivity. A through hole(s) passing through the ground layer is formed in the printed circuit board. A projecting portion(s), which is inserted into the through hole(s), is formed in a projecting manner in the shield case. In a state of being inserted in the through hole(s), the projecting portion(s) is electrically connected to the ground layer via solder.

11 Claims, 9 Drawing Sheets

(56) References Cited

U.S. PATENT DOCUMENTS

| | | | |
|---|---|---|---|
| 2012/0281386 A1* | 11/2012 | Kim | H05K 9/0028 |
| | | | 361/818 |
| 2013/0003326 A1* | 1/2013 | Kobayashi | H05K 9/006 |
| | | | 361/753 |
| 2013/0048369 A1* | 2/2013 | Malek | H05K 9/0032 |
| | | | 29/592.1 |

* cited by examiner

ELECTRONIC DEVICE CAPABLE OF SUPPRESSING HIGH GROUND IMPEDANCE, AND METHOD FOR MANUFACTURING THE ELECTRONIC DEVICE

BACKGROUND OF THE INVENTION

Field of the Invention

The present invention relates to an electronic device that is capable of suppressing high ground impedance, and a method for manufacturing the electronic device.

Description of the Related Art

In recent years, as wireless communication devices have become widespread, a shield case that shields a wireless communication device from electromagnetic waves or the like has been known. Japanese Patent No. 3067326 discloses a technique in which, to mount the shield case on a board land, the board land and the shield case are joined together by reflow soldering. Japanese Laid-Open Patent Publication (Kokai) No. 2010-192756 discloses positioning of the shield case.

According to Japanese Patent No. 3067326, when, for example, an attempt is made to downsize a wireless communication device, there is room for improvement in the shielding effect achieved by the shield case. Specifically, the attempt is made to downsize the wireless communication device, as the downsize thereof, the area of a ground layer land pattern on a surface layer of a board is reduced accordingly, and it is feared that it will be difficult to secure (form) a sufficient area of the ground layer land pattern, depending on the size of the downsized wireless communication device. Japanese Laid-Open Patent Publication (Kokai) No. 2010-192756 has a problem that if the impedance (ground impedance) between the ground layer land pattern, whose area cannot be secured to a sufficient level, and the shield case is high, the shielding effect of the shield case will decrease. Thus, there is a demand for an electronic device capable of keeping the impedance between the shield case and the ground layer low. It is noted that Japanese Laid-Open Patent Publication (Kokai) No. 2010-192756 neither discloses nor suggests a configuration for keeping the impedance low.

SUMMARY OF THE INVENTION

The present invention provides an electronic device that is capable of suppressing the high impedance (ground impedance) between a printed circuit board and a shield case, and a method for manufacturing the electronic device.

Accordingly, the present invention provides an electronic device including a printed circuit board comprising at least one ground layer that has conductivity, wherein the at least one ground layer is provided at a location in a middle in a thickness direction of the printed circuit board, and a shield case that is placed on one side of the printed circuit board and consists of a hollow body that has conductivity, wherein at least one through hole passing through the at least one ground layer is formed in the printed circuit board, at least one projecting portion to be inserted into the at least one through hole is formed in a projecting manner in the shield case, and in a state of being inserted in the through hole, the projecting portion is electrically connected to the at least one ground layer via solder.

According to the present invention, the high impedance (ground impedance) between the printed circuit board and the shield case can be suppressed.

Further features of the present invention will become apparent from the following description of exemplary embodiments with reference to the attached drawings.

DESCRIPTION OF THE EMBODIMENTS

The present invention will now be described in detail below with reference to the accompanying drawings showing embodiments thereof. It is to be understood, however, that configurations in the embodiments described below are only illustrative, and the scope of the present invention is not intended to be limited by the configurations in the embodiments.

Figure 1:
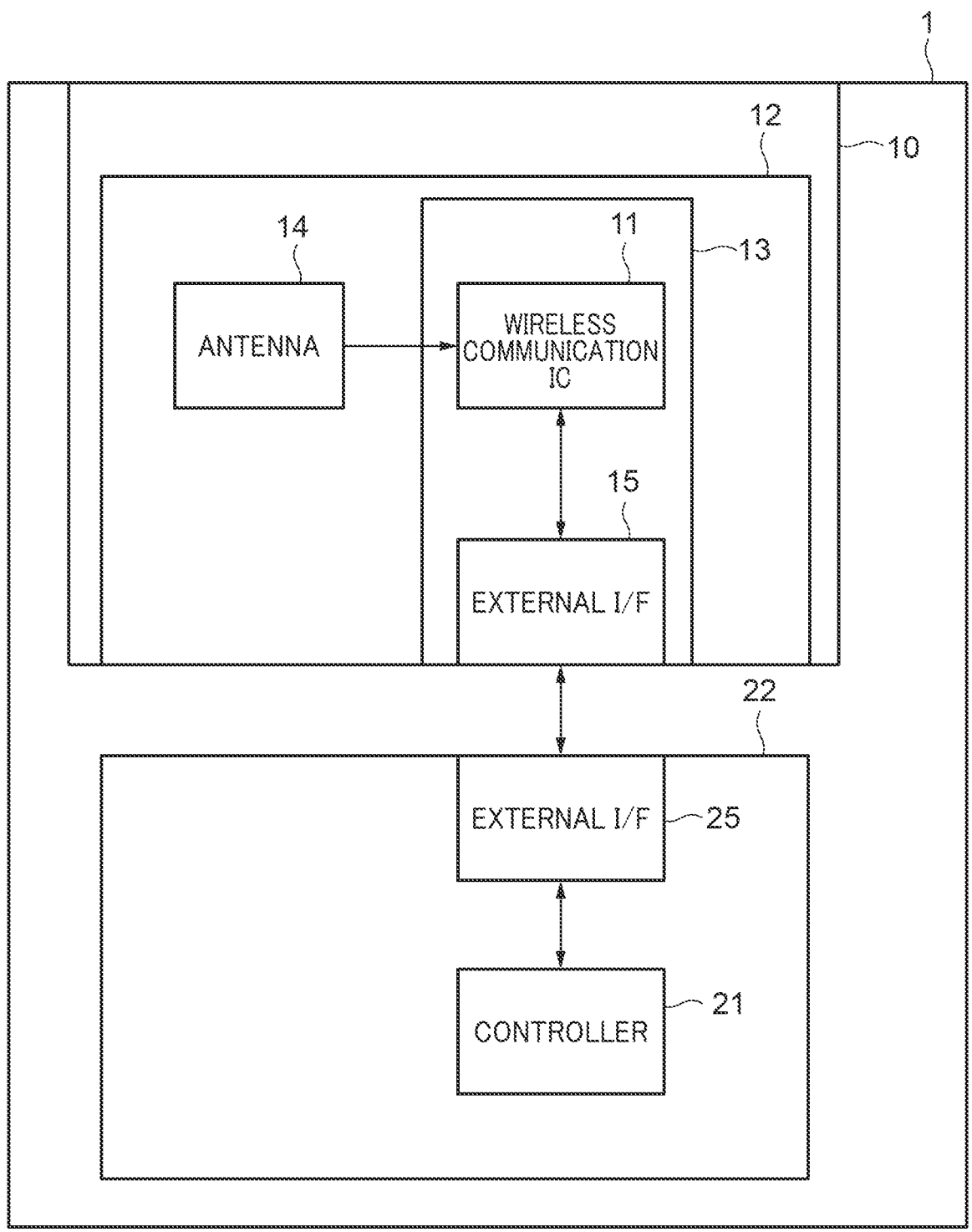
FIG. 1 is a block diagram showing an example of a configuration of an electronic device according to a first embodiment of the present invention.

Referring to FIG. 1 to FIG. 5, a description will now be given of a first embodiment of the present invention. FIG. 1 is a block diagram showing an example of a configuration of an electronic device 1 according to the first embodiment of the present invention. As shown in FIG. 1, the electronic device 1 has a wireless communication device 10 and a control device (controller board) 22, which controls the wireless communication device 10.

The wireless communication device 10 has a wireless communication IC 11, a printed circuit board 12, a shield case 13, an antenna 14, and an external interface (I/F) 15. The wireless communication IC 11 is an electronic component that carries out communications using communication standards such as Wi-Fi (registered trademark) and Bluetooth (registered trademark). The wireless communication IC 11 is mounted on the printed circuit board 12. The shield case 13 is disposed on a surface of the printed circuit board 12 and on the same side as the wireless communication IC 11. The shield case 13 is comprised of a box-shaped hollow body that has conductivity, and shields the wireless communication IC 11 inside thereof. The antenna 14 is an antenna for wireless communication and provided on the surface of the printed circuit board 12 and on the same side as the wireless communication IC 11. The antenna 14 is electrically connected to a circuit pattern 128 on the printed circuit board 12. The external interface 15 is, for example, a USB device interface and mounted on the surface of the printed circuit board 12 and on the same side as the wireless communication IC 11. The external interface 15 is electrically connected to the circuit pattern 128 on the printed circuit board 12.

The control device 22 has a controller 21 and an external interface (I/F) 25. The controller 21 is capable of communicating with the external interface 15 of the wireless communication device 10 via the external interface 25 and controls the wireless communication device 10.

Figure 2:
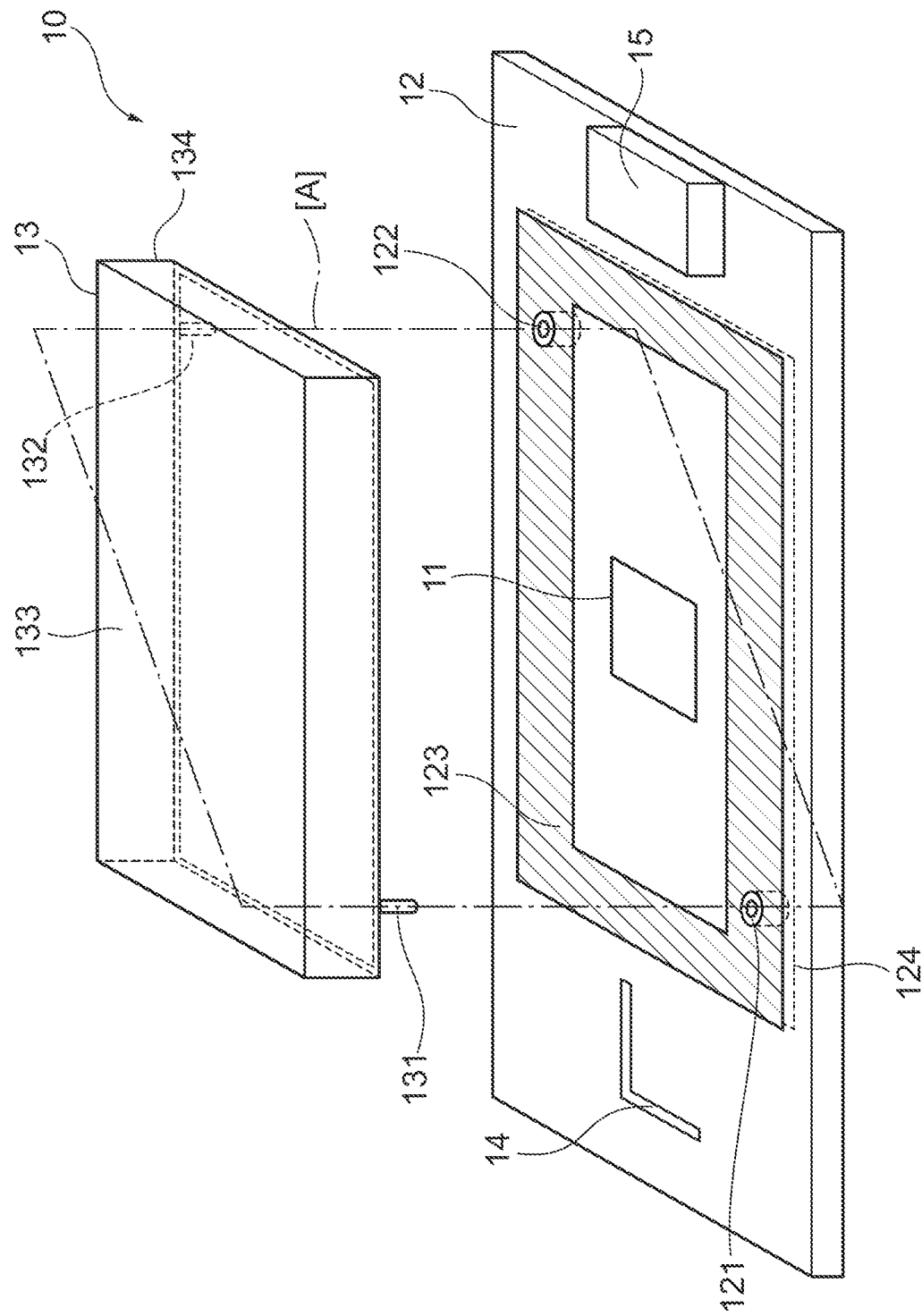
FIG. 2 is an exploded perspective view of a wireless communication device which the electronic device in FIG. 1 has.
Figure 3A:
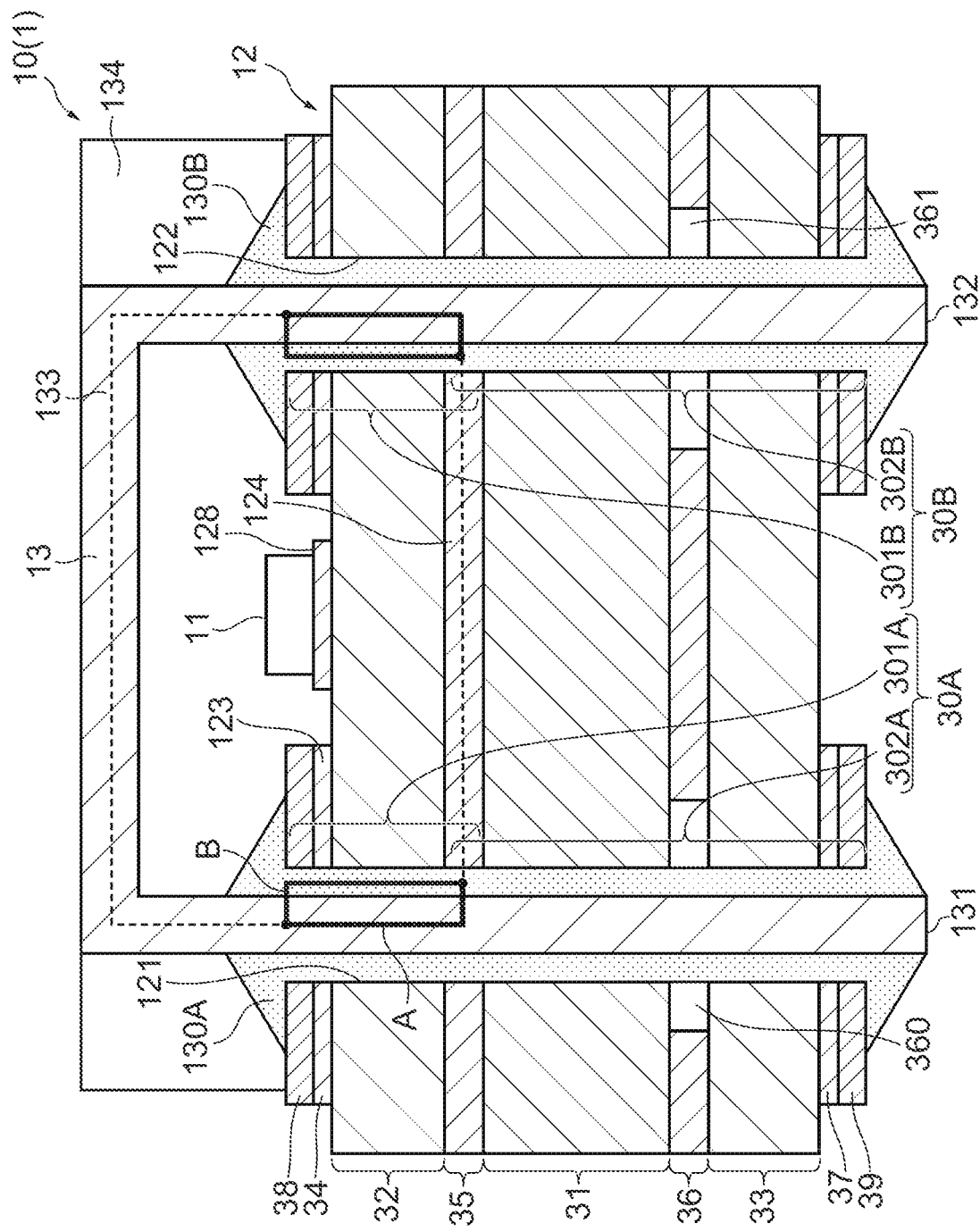
FIG. 3A is a cross-sectional view taken along a plane [A] enclosed by dashed dotted lines in FIG. 2.

FIG. 2 is an exploded perspective view of the wireless communication device 10 which the electronic device 1 in FIG. 1 has. FIG. 3A is a cross-sectional view taken along a plane [A] enclosed by dashed dotted lines in FIG. 2. As shown in FIG. 2 and FIG. 3A, the printed circuit board 12 is a laminate with a plurality of layers. In the present embodiment, the printed circuit board 12 has a core material (core layer) 31 disposed in the center of the printed circuit board 12 in a thickness direction, a prepreg 32 disposed on the front surface of the core material 31 (the upper side of the core material 31 as viewed in FIG. 3A), and a prepreg 33 disposed on the back surface of the core material 31 (the lower side of the core material 31 as viewed in FIG. 3A). The printed circuit board 12 also has an L1 layer 34, an L2 layer 35, an L3 layer 36, and an L4 layer 37, all of which have conductivity. It is noted that although in the present embodiment, the L1 layer 34 through the L4 layer 37 are made of, for example, copper foil, they have only to be made of a conductive material and they are not limited by copper foil. The L1 layer 34 is provided on the front surface (one side) of the prepreg 32 (the upper side of the prepreg 32 as viewed in FIG. 3A). The L1 layer 34 has the circuit pattern 128, which is electrically connected to the wireless communication IC 11, and a land pattern 123, which is electrically connected to the shield case 13 and functions as a first ground layer (front-side ground layer). A copper plaiting layer 38 is provided on the land pattern 123. The L2 layer 35 is provided between the prepreg 32 and the core material 31, that is, at a location different from that of the land pattern 123 in the thickness direction of the printed circuit board 12 (i.e., at a location in the middle in the thickness direction of the printed circuit board 12). The L2 layer 35 has a ground pattern 124, which is electrically connected to the shield case 13 and functions as a second ground layer (middle ground layer). The L3 layer 36 is provided between the core material 31 and the prepreg 33, that is, at a location in the middle in the thickness direction. The L4 layer 37 is provided on the back surface of the prepreg 33 (the lower side of the prepreg 33 as viewed in FIG. 3A), and electrically connected to the shield case 13 and functions as a third ground layer (back-side ground layer). A copper plaiting layer 39 is provided on the L4 layer 37.

As shown in FIG. 2, the wireless communication IC 11 is disposed in an area enclosed by the land pattern 123 on the printed circuit board 12. The antenna 14 and the external interface 15 are disposed outside the land pattern 123 on the printed circuit board 12. In the present embodiment, the antenna 14 is a pattern antenna, and the external interface 15 is, for example, a USB device interface.

As shown in FIG. 3A, a through hole 121 and a through hole 122 are formed in the printed circuit board 12. The through hole 121 and the through hole 122 pass through the land pattern 123 (the L1 layer 34), the prepreg 32, the ground pattern 124 (the L2 layer 35), the core material 31, the prepreg 33, and the L4 layer 37. It is noted that although in the present embodiment, the number of through holes are formed in the printed circuit board 12 is two, this is not limitative, and the number of through holes may be, for example, one, or three or more.

A connecting portion 301A, which connects the land pattern 123 (including the copper plating layer 38) and the ground pattern 124 together, and a connecting portion 302A, which connects the ground pattern 124 and the L4 layer 37 together, are provided in an inner peripheral portion of the through hole 121. The connecting portion 301A and the connecting portion 302A are each made of a conductive material such as copper. Thus, the land pattern 123 and the ground pattern 124 are electrically connected together via the connecting portion 301A, and the ground pattern 124 and the L4 layer 37 are connected together via the connecting portion 302A. The connecting portion 301A and the connecting portion 302A constitute a cylindrical ground portion (conductor post) 30A, which passes through the printed circuit board 12 in the thickness direction. A space 360 is formed between the ground portion 30A and the L3 layer 36, and the ground portion 30A is apart from the L3 layer 36.

As with the through hole 121, a connecting portion 301B, which connects the land pattern 123 and the ground pattern 124 together, and a connecting portion 302B, which connects the ground pattern 124 and the L4 layer 37 together, are provided in an inner peripheral portion of the through hole 122. The connecting portion 301B and the connecting portion 302B are each made of a conductive material such as copper. Thus, the land pattern 123 and the ground pattern 124 are electrically connected together via the connecting portion 301B, and the ground pattern 124 and the L4 layer 37 are connected together via the connecting portion 302B. The connecting portion 301B and the connecting portion 302B constitute a cylindrical ground portion (conductor post) 30B, which passes through the printed circuit board 12 in the thickness direction. As with the ground portion 30A, a space 361 is formed between the ground portion 30B and the L3 layer 36, and the ground portion 30B is apart from the L3 layer 36.

In plan view of the printed circuit board 12, the wireless communication IC 11 is located between the through hole 121 and the through hole 122 (see FIG. 2). The wireless communication IC 11 is covered with the shield case 13 from the front side. The shield case 13, which is a box-shaped member with a top 133, a side wall 134, and an opened bottom, is constructed by punching out, by e.g., press work, a conductive plate material (for example, a tin plate (SPTE, tin plated steel plate) with a thickness of 0.2 mm) into a desired shape to form a base metal and then bending the base metal. In a lower edge portion of the side wall 134, a leg portion (projecting portion) 131 and a leg portion (projecting portion) 132 are formed such that they project downward. As shown in FIG. 3A, the leg portion 131 is inserted into the through hole 121. In the state of being inserted in the through hole 121, the leg portion 131 is electrically connected to the ground portion 30A (including the land pattern 123, the ground pattern 124, and the L4 layer 37), which is comprised of the connecting portion 301A and the connecting portion 302A, via solder 130A. The solder 130A is provided over the entire length and entire circumference of the inner peripheral portion of the through hole 121. The leg portion 132 is inserted into the through hole 122. In the state of being inserted in the through hole 122, the leg portion 132 is electrically connected to the ground portion 30B (including the land pattern 123, the ground pattern 124, and the L4 layer 37), which is comprised of the connecting portion 301B and the connecting portion 302B, via solder 130B. The solder 130B is provided over the entire length and entire circumference of the inner peripheral portion of the through hole 122. With this configuration, a sufficient contact area between the printed circuit board 12 and the shield case 13 can be secured, and therefore, the high impedance (ground impedance) between the printed circuit board 12 and the shield case 13 can be suppressing. In particular, a low-impedance conduction path is secured by a path indicated by a dotted line in FIG. 3A, and hence the wireless communication IC 11 is electrostatically shielded.

A conductive material (electrical conductor) such as iron is used for the shield case 13 so as to also serve as a magnetic shield that shields the effects of a magnetic field (electromagnetic induction), an electromagnetic shield that shields the effects of an electromagnetic wave, and an electrostatic shield that shields the effects of an electric field (electrostatic induction). For example, in the case where the conductive material is used for the shield case 13 as the magnetic shield, the conductive material satisfactorily acts as the magnetic shield because magnetic lines of force are canceled by an overcurrent occurring in the conductive material at high frequencies such as the 2.4 GHz frequency band and the 5 GHz frequency band used for wireless communications such as Wi-Fi (registered trademark) and BLE.

The electromagnetic shield is intended to shield an electromagnetic wave that propagates a combination of alternating electric field and magnetic field. In a case where the antenna 14 is a dipole antenna, for the wireless communication IC 11, consideration should be given to the electromagnetic shield in a near field that is relatively close to the antenna 14. In the near field, an electric field component is dominant, and the surge impedance is very high. In the case where the conductive material is used for the shield case 13 as the electromagnetic shield, the return loss is high because surge impedance in the conductive material is only about 1Ω as compared to the surge impedance of 377Ω, in the air, and therefore, the conductive material satisfactorily acts as the electromagnetic shield.

In the case where the conductive material is used for the shield case 13 as the electrostatic shield, current noise caused by an electric field of a noise (electrostatic induction) propagates to the ground portion 30A and the ground portion 30B via the shield case 13 that is earthed in consideration of parasitic capacitance. As a result, an internal circuit portion of the wireless communication IC 11 shielded by the shield case 13 is protected from the electric field of noise. Here, consideration should be given to the ground impedance of the shield case 13 in order to reduce the effects of the noise current flowing through the electrostatic shield. The reason is that as the ground impedance decreases, the noise current decreases accordingly, and the noise voltage also decreases, leading to an improvement in the shielding effect.

In plan view of the printed circuit board 12, the through hole 121 and the through hole 122 are circular (see FIG. 2). It is noted that although the diameter of the through hole 121 and the diameter of the through hole 122 are the same in the present embodiment, this is not limitative, and they may be different. The leg portion 131, which is inserted into the through hole 121, has a circular column shape, and its diameter is sufficiently smaller than that of the through hole 121. The leg portion 132, which is inserted into the through hole 122, is also has a circular column shape, and its diameter is sufficiently smaller than that of the through hole 122. As a result, the leg portion 131 can be easily inserted into the through hole 121, and the leg portion 132 can be easily inserted into the through hole 122. Therefore, the printed circuit board 12 and the shield case 13 can be assembled speedily together. Moreover, with this configuration, the shield case 13 can be positioned with respect to the printed circuit board 12, and hence the shield case 13 can be prevented from coming into contact with a undesired pattern so that shorts can be prevented.

Figure 3B:
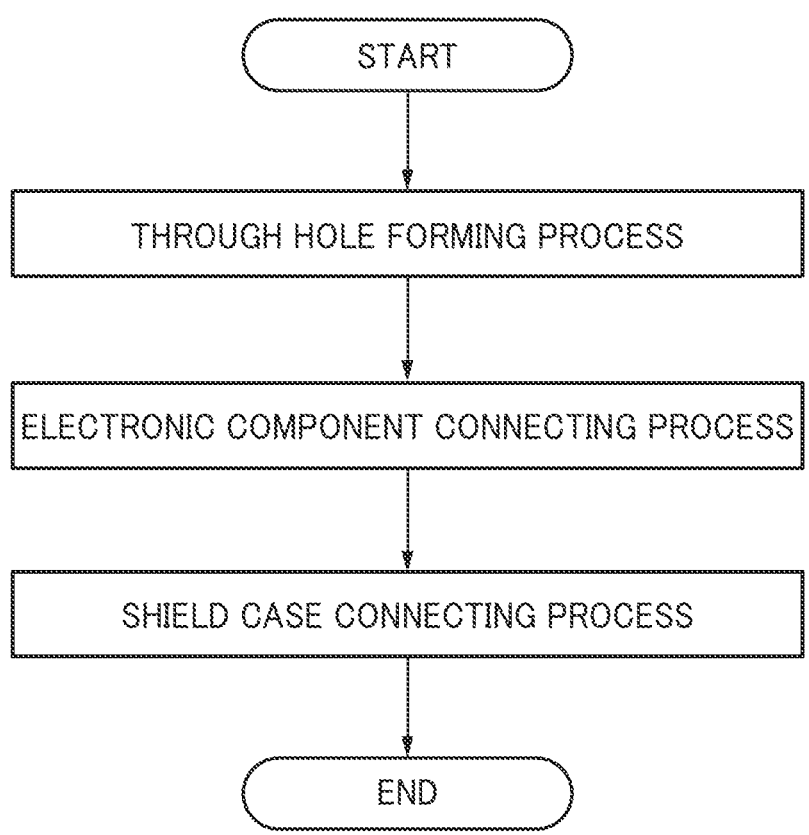
FIG. 3B is a flowchart showing a manufacturing process for the wireless communication device which the electronic device in FIG. 1 has.

Referring to FIG. 3B, a description will now be given of a manufacturing method for the wireless communication device 10 (the electronic device 1). FIG. 3B is a flowchart showing a manufacturing process for the wireless communication device 10 which the electronic device 1 in FIG. 1 has. As shown in FIG. 3B, the manufacturing process for the wireless communication device 10 includes a through hole forming process, an electronic component connecting process, and a shield case connecting process, and they are performed in this order. In the through hole forming process, first, the printed circuit board 12, in which the through hole 121 and the through hole 122 have not yet been formed is prepared. Next, the printed circuit board 12 is subjected to machining in which the through hole 121 and the through hole 122 are formed. After the machining, the inner peripheral portion of the through hole 121 and the inner peripheral portion of the through hole 122 are subjected to plating, forming the ground portion 30A and the ground portion 30B. Moreover, the copper plating layer 38 and the copper plating layer 39 can also be formed in the plating.

In the electronic component connecting process, first, the wireless communication IC 11 is prepared. Next, the wireless communication IC 11 and the circuit pattern 128 on the printed circuit board 12 are connected together via solder. In the shield case connecting process, first, the shield case 13 is prepared. Next, the leg portion 131 of the shield case 13 is inserted into the through hole 121, and the leg portion 132 of the shield case 13 is inserted into the through hole 122. Then, solder is supplied between the leg portion 131 and the ground portion 30A to connect the leg portion 131 and the ground portion 30A together via the solder. Solder is also supplied between the leg portion 132 and the ground portion 30B to connect the leg portion 132 and the ground portion 30B together via the solder.

It is preferable, after any process among the through hole forming process, the electronic component connecting process, and the shield case connecting process, to carry out a process for connecting the external interface 15 and the printed circuit board 12 together via solder. As a result of the processes described above, the wireless communication device 10 in which the high impedance between the printed circuit board 12 and the shield case 13 is suppressed can be obtained.

Figure 4:
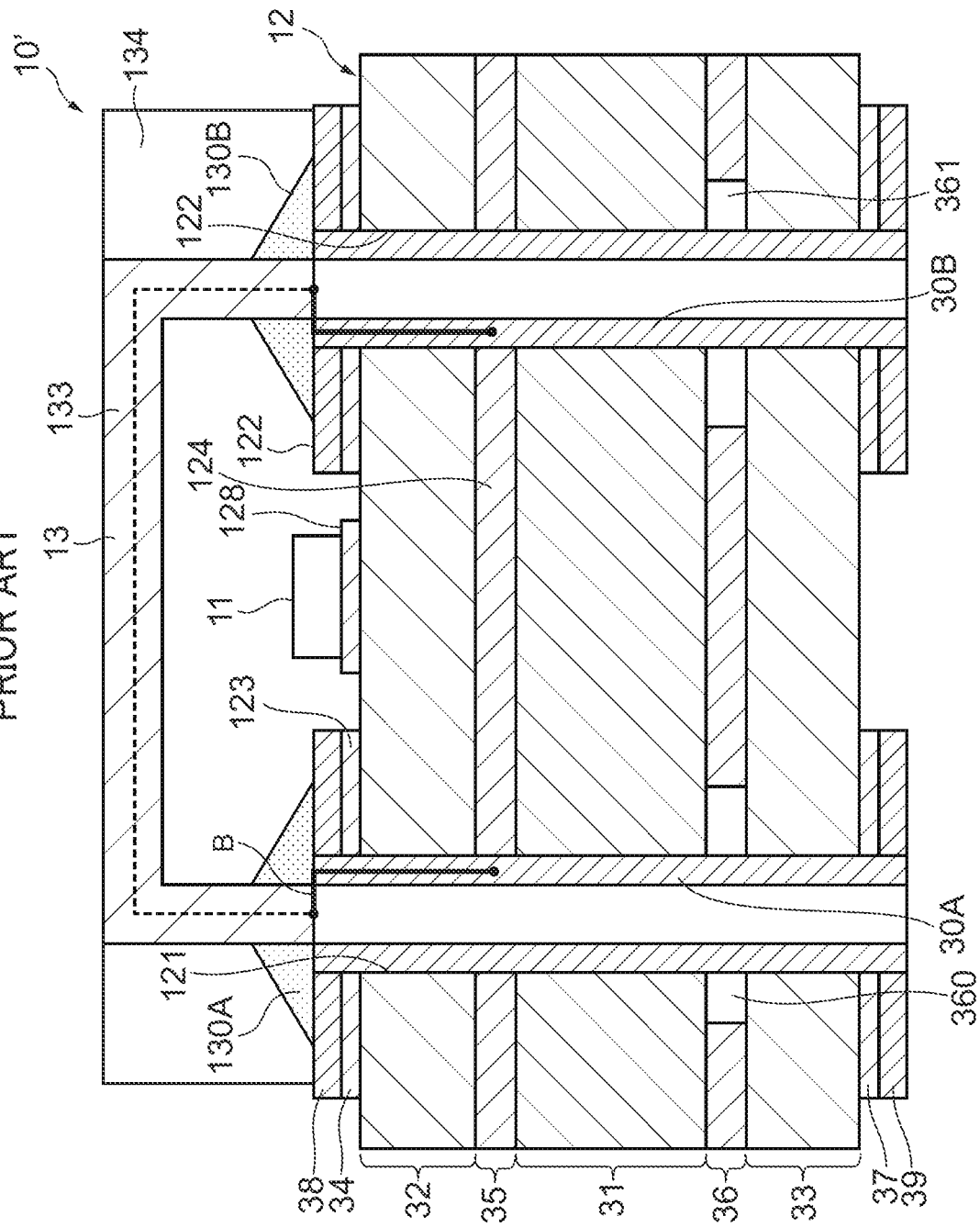
FIG. 4 is a cross-sectional view showing a configuration of a comparative example (an example of a prior art) which is compared with the present invention.

FIG. 4 is a cross-sectional view showing a configuration of a comparative example (an example of a prior art), which is compared with the present invention. As shown in FIG. 4, a wireless communication device 10', which is the comparative example, is configured such that the leg portion 131 and the leg portion 132 are omitted from the shield case 13 as distinct from the wireless communication device 10 according to the present invention. It is noted that in the wireless communication device 10' as the comparative example, a low-impedance conduction path is secured by a path indicated by a dotted line, and hence the wireless communication IC 11 is electrostatically shielded, as with the wireless communication device 10 according to the present invention.

Here, comparing the path indicated by the dotted line in FIG. 3A (the present invention) and the path indicated by the dotted line in FIG. 4 (the prior art) with each other, thick lines between the shield case 13 and the ground pattern 124 are different. Specifically, in the configuration shown in FIG. 3A, a thick-line path A and a thick-line path B are formed, whereas in the configuration shown in FIG. 4, there is no thick-line path A, and only a thick-line path B is formed. Therefore, in the configuration shown in FIG. 3A, the shield case 13 has the thick-line path A, which is extended by the leg portion 131 and the leg portion 132, as a circuit parallel with the thick-line path B. As a result, low impedance can be achieved. It is noted that an ordinary through hole has a larger diameter than that of a through-via, and the resistance value of the thick-line path B itself is low as well.

Figure 5:
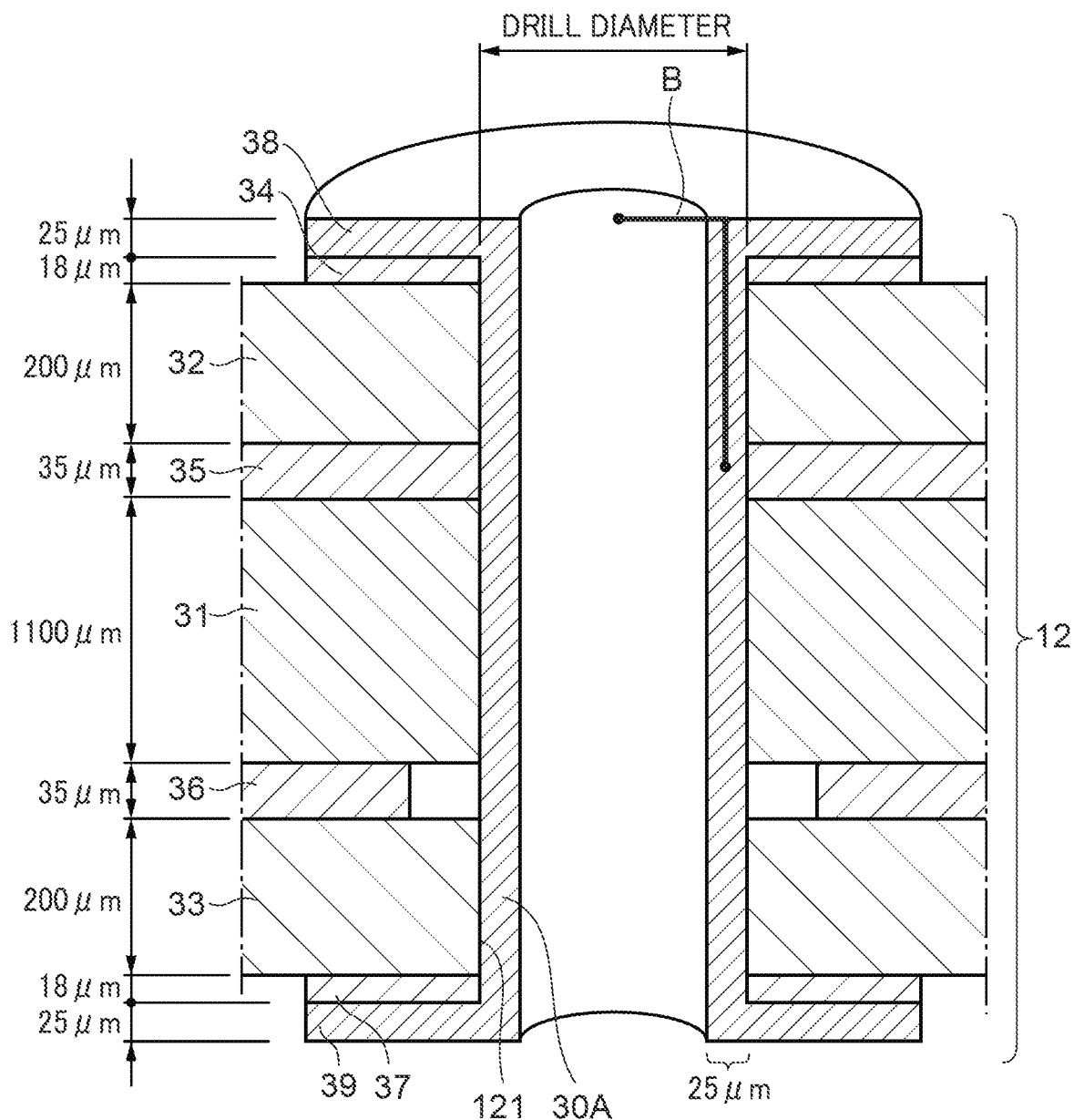
FIG. 5 is a cross-sectional view showing the relationship between the sizes of layers of a printed circuit board and size of through holes in FIG. 3A.

FIG. 5 is a cross-sectional view showing the relationship between the sizes of the layers of the printed circuit board 12 and the size of the through hole 121 (122) in FIG. 3A. The printed circuit board 12 in FIG. 5 is an ordinary printed circuit board with a thickness h of 1.6 mm. For example, the thickness of the core material 31 is 1100 µm, the thickness of the prepreg 32 is 200 µm, and the thickness of the prepreg 33 is 200 µm. For example, the thickness of the L1 layer 34 is 18 µm, the thickness of the L2 layer 35 is 35 µm, the thickness of the L3 layer 36 is 35 µm, the thickness of the L4 layer 37 is 18 µm, the thickness of the copper plating layer 38 is 25 µm, and the thickness of the copper plating layer 39 is 25 µm. The thickness of the ground portion 30A is 25 µm (the thickness of the round portion 30B is the same).

For FIG. 5, the relationship between the resistance value R, and the through hole diameter $2r_0$, the coating thickness $2r_1$, the plate thickness h, and the conductor's conductivity σ, can be expressed by Equation 1 below. It is noted that conductivity of copper $\rho_{cu}$ is expressed by $\sigma_{cu}$=6.0×10$^7$ [S/m].

[Math 1]

$$R = \frac{h}{\sigma_{CU} \pi (r0^2 - r1^2)} \quad \text{Equation 1}$$

For example, for the configuration shown in FIG. 4, in a case of a through-via with a drill diameter of 0.6 mm, assuming that the length $L_B$ of the thick-line path B from the L1 layer 34 to the L2 layer 35 is 200 µm+25 µm+18 µm+35 µm, the resistance value $R_{BVH}$ of the through-via is expressed by $R_{BVH}$=0.0041 [mΩ].

On the other hand, for the configuration shown in FIG. 3A, in a case of the through hole 121 with a drill diameter of 0.7 mm, the resistance value $R_{BTH}$ of the through hole 121 on the thick-line path B from the L1 layer 34 to the L2 layer 35 is expressed by $R_{BTH}$=0.0030 [mΩ]. Assume that the shield case 13 is made of a tin steel plate with a thickness t=76 µm, and the leg portion 131 has a thickness W=0.4 mm. Assuming that a high-frequency electric current flows on the surface of the shield case 13 due to the skin effect, and the length $L_A$ of the thick-line path A is 200 µm+25 µm+18 µm+35 µm, the resistance value $R_{ASPTE}$ is expressed by Equation 2 below. It is noted that the conductivity of tin $\sigma_{SPTE}$ is expressed by $\sigma_{SPTE}$=9.2×10$^6$ [S/m].

$$R_{ASPTE} = \rho_{SPTE} \times L_A/(W \times t) = 0.0010 \text{ mΩ} \quad \text{Equation 2}$$

Assuming that a parallel circuit has only the resistance value of the thick-line path A and the resistance value of the thick-line path B so as to simplify the explanation, for the configuration shown in FIG. 3A, the combined resistance value R is expressed by R=1 (1/$R_{ASPTE}$+1/$R_{BTH}$=0.00075 [mΩ]. Thus, the impedance as low as about 18% relative to the resistance value $R_{BVH}$=0.0041 [mΩ] in FIG. 4 can be implemented. It is noted that there is also a path via the solder 130A and the through hole 121 between the thick-line path A and the thick-line path B in FIG. 3A, and hence the actual impedance is much lower. As described above, in the wireless communication device 10 according to the present embodiment, the impedance is kept lower than that in the comparative example 10'. Although in the above description, a calculation example for one through hole and one leg portion is taken, the impedance can be further reduced by using a plurality of through holes and a plurality of leg portions.

Figure 6:
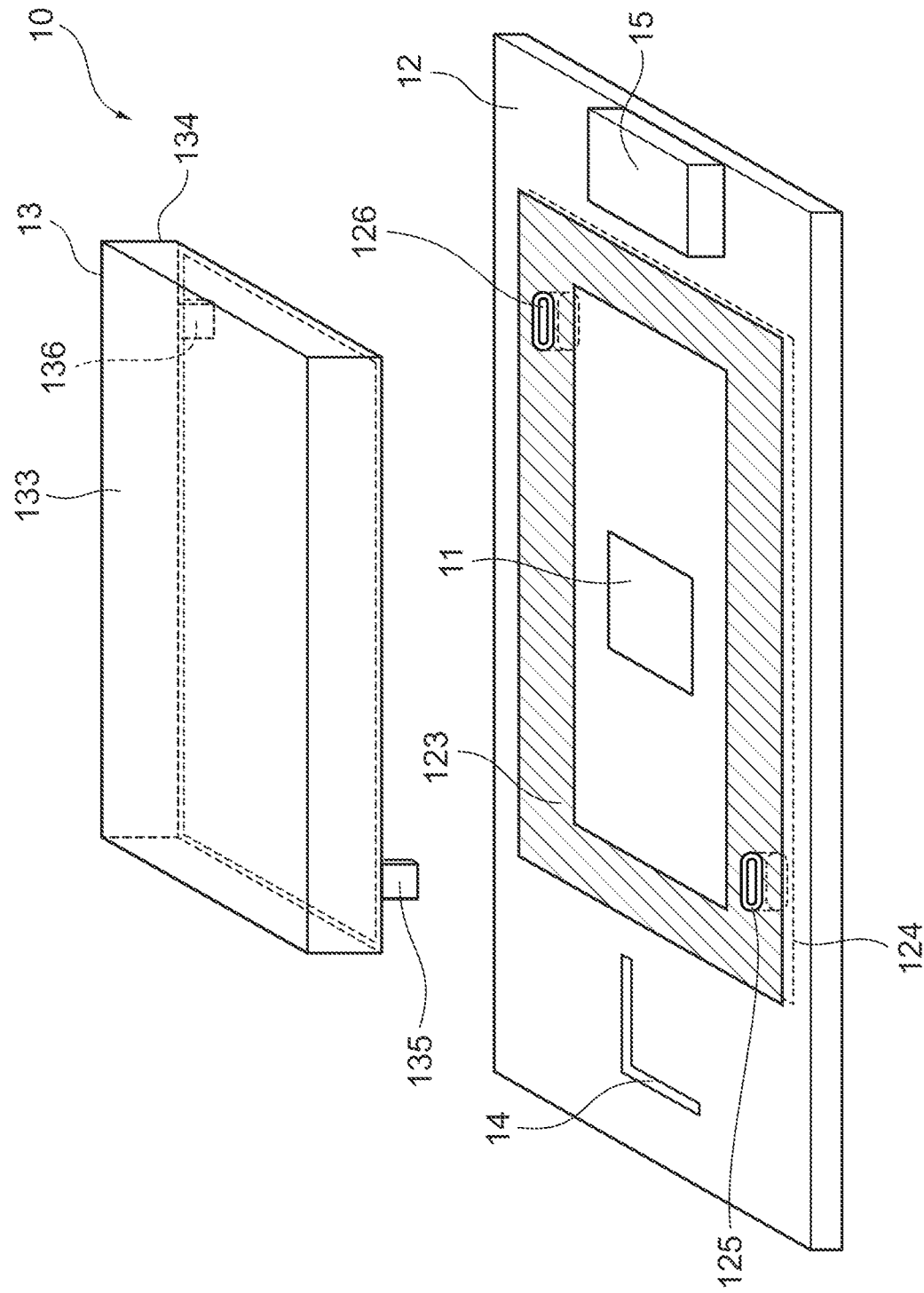
FIG. 6 is an exploded perspective view of a wireless communication device which an electronic device according to a second embodiment of the present invention has.

A description will now be given of a second embodiment. FIG. 6 is an exploded perspective view of a wireless communication device which an electronic device 10 according to the second embodiment of the present invention has. As shown in FIG. 6, the printed circuit board 12 has a through hole 125 and a through hole 126. In plan view of the printed circuit board 12, the through hole 125 and the through hole 126 are each oval. The direction of the long diameter of the oval shape of the through hole 125 and the direction of the long diameter of the oval shape of the through hole 126 are the same. The shield case 13 has a leg portion 135 to be inserted into the through hole 125, and a leg portion 136 to be inserted into the through hole 126. The leg portion 135 and the leg portion 136 each has a plate-like shape.

Generally, in a case where the shield case 13 is subjected to sheet-metal working with an ordinary sheet-metal press machine, it is feared that it will be difficult to implement the leg portion 131 and the leg portion 132, which has a circular column shape with a thickness of, for example, 0.4 mm, with high precision. Accordingly, in the present embodiment, the shield case 13 is provided with the leg portion 135 and the leg portion 136, which have a plate-like shape with a width of, for example, 1.0 mm. By adopting this design, the leg portion 135 and the leg portion 136 can be easily implemented with high precision by the shield case 13 being machined with an ordinary sheet-metal press machine. In this case, the through hole 125 and the through hole 126 are formed so as to have an oval shape with, for example, a long diameter of 1.4 mm and a short diameter of 0.7 mm. As a result, the through hole resistance value $R_{BTH}$ on the thick-line path B from the L1 layer 34 to the L2 layer 35 further decreases. Specifically, $R_{BTH}$–0.00000013 [mΩ]. As the width of the leg portion 135 and the leg portion 136 increases, the resistance value $R_{ASPTE}$ on the thick-line path A further decreases as well. Specifically, as the width of the leg portion 135 and the leg portion 136 increases to 1.0 mm, $R_{ASPTE}$=0.00040 [mΩ] holds. When their combined resistance value R2 is calculated in the same manner as in the first embodiment, R2=(1/$R_{ASPTE}$+1/$R_{BTH}$)≈$R_{BTH}$=0.00000013 [mΩ] holds. Thus, the impedance can be kept at further low.

Figure 7:
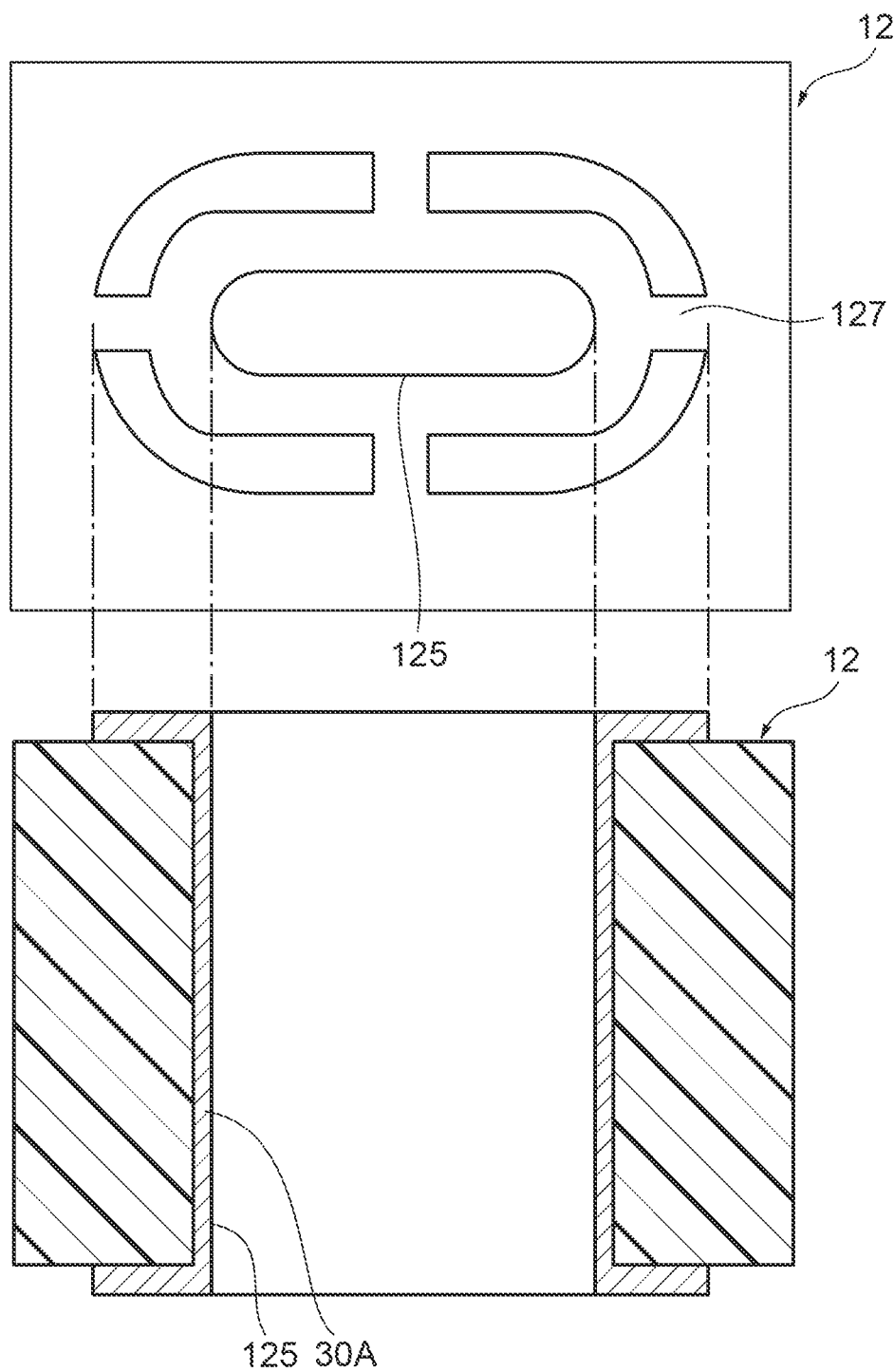
FIG. 7 is a plan view and a cross-sectional view of a wireless communication device which an electronic device according to a third embodiment of the present invention has.

A description will now be given of a third embodiment. FIG. 7 is a plan view and a cross-sectional view of a wireless communication device which an electronic device according to the third embodiment of the present invention has. As shown in FIG. 7, a processed portion 127, which has been subjected to thermal land processing, is provided around the through hole 125 (the same holds for the through hole 126). For the oval through hole 125, thermal capacity during soldering is large, and thus the solderability is improved by the processed portion 127. It is noted that the processed portion 127 may be provided not only in the L1 layer 34 but also in any of the L2 layer 35, the L3 layer 36, and the L4 layer 37 or all of them.

Figure 8:
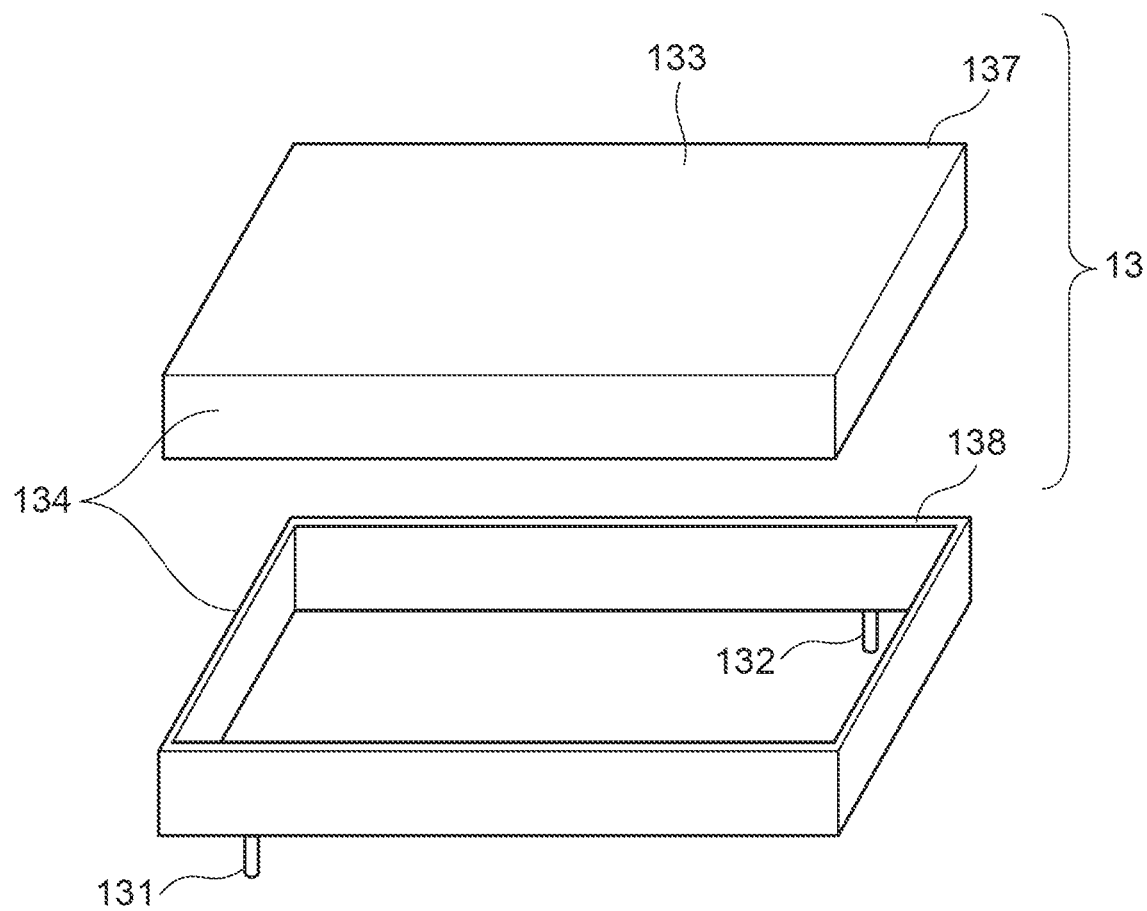
FIG. 8 is an exploded perspective view of a shield case which an electronic device according to a fourth embodiment of the present invention has.

A description will now be given of a fourth embodiment. FIG. 8 is an exploded perspective view of a shield case which an electronic device according to the fourth embodiment of the present invention has. As shown in FIG. 8, the shield case 13 is configured so as to be divided into a plurality of members, i.e., a shield case upper portion (upper member) 137 and a shield case lower portion (lower member) 138 in the thickness direction of the printed circuit board 12. The shield case upper portion 137 and the shield case lower portion 138 are assembled by, for example, projections and depressions engaging. One out of the shield case upper portion 137 and the shield case lower portion 138 which is located on the printed circuit board 12 side, that is, the shield case lower portion 138 which is on the lower side as viewed in FIG. 8, has the leg portion 131 and the leg portion 132. The shield case upper portion 137 is removably mounted on the shield case lower portion 138. As a result, in the shield case 13, even if the shield case lower portion 138 is fixed to the printed circuit board 12, the shield case upper portion 137 can be removed from the shield case lower portion 138. Thus, for example, inspections such as a visual inspection and a camera inspection can be easily performed for the wireless communication IC 11.

Moreover, to fix the shield case 13 to the printed circuit board 12, first, the shield case lower portion 138 is fixed to the printed circuit board 12 with the shield case upper portion 137 and the shield case lower portion 138 separated from each other. This can reduce the thermal capacity in soldering described above, and pretreatment such as preheating of the shield case 13 can be omitted, making low-cost fixing possible. Then, after the shield case lower portion 138 is fixed to the printed circuit board 12, the shield case upper portion 137 is mounted to the shield case lower portion 138. Although in the present embodiment, the shield case 13 is comprised of two members, the number of members constituting the shield case 13 is not limited to two, and may be, for example, three or more.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-51124 filed on Mar. 28, 2022, which is hereby incorporated by reference wherein in its entirety.

What is claimed is:

1. An electronic device including:
   a printed circuit board comprising at least one ground layer that has conductivity, wherein the at least one ground layer is provided at a location in a middle in a thickness direction of the printed circuit board; and
   a shield case that is placed on one side of the printed circuit board and that is comprised of a hollow body that has conductivity,
   wherein at least one through hole passing through the at least one ground layer is formed in the printed circuit board,
   at least one projecting portion to be inserted into the at least one through hole is formed in a projecting manner in the shield case,
   in a state of being inserted in the through hole, the projecting portion is electrically connected to the at least one ground layer via solder,
   the printed circuit board comprises a front-side ground layer that has conductivity and is different from the ground layer, wherein the front-side ground layer is provided on the one side,
   the projecting portion is electrically connected to the front-side ground layer via the solder,
   the printed circuit board comprises a connecting portion that has conductivity, wherein the connecting portion is provided in an inner peripheral portion of the through hole and electrically connects the at least one ground layer and the front-side ground layer to each other, and
   the projecting portion is electrically connected to the connecting portion via the solder.

2. The electronic device according to claim 1, wherein the solder is provided over the entire length and entire circumference of the inner peripheral portion of the through hole.

3. The electronic device according to claim 1, wherein the through hole is circular or oval in plan view of the printed circuit board.

4. The electronic device according to claim 1, wherein the projecting portion has a circular column shape or plate-like shape.

5. The electronic device according to claim 1, wherein a portion of the printed circuit board around the through hole is subjected to thermal land processing.

6. The electronic device according to claim 1, wherein
   the shield case comprises a plurality of members capable of being separated from each other in the thickness direction of the printed circuit board, and
   among the plurality of members, a member located on the printed circuit board side has the at least one projecting portion.

7. The electronic device according to claim 1, wherein with the at least one projecting portion inserted in the at least one through hole, the shield case is positioned with respect to the printed circuit board.

8. The electronic device according to claim 1, further including an electronic component disposed on the one side of the printed circuit board and covered with the shield case.

9. The electronic device according to claim 8, wherein two through holes are formed, and in plan view of the printed circuit board, the electronic component is located between the two through holes.

10. An electronic device comprising:
a printed circuit board; and
a shield case that is disposed on one side of the printed circuit board and that is comprised of a hollow body that has conductivity,
wherein at least one through hole passes through the printed circuit board, and a ground portion that has conductivity is formed in an inner peripheral portion of the through hole,
at least one projecting portion to be inserted into the at least one through hole is formed in a projecting manner in the shield case, and
in a state of being inserted in the through hole, the projecting portion is electrically connected to the ground portion via solder.

11. A manufacturing method for an electronic device including a printed circuit board comprising at least one ground layer that has conductivity and is provided at a location in a middle in a thickness direction of the printed circuit board, and a shield case that is placed on one side of the printed circuit board and that is comprised of a hollow body that has conductivity, the manufacturing method comprising:
forming at least one through hole, which passes through the at least one ground layer, in the printed circuit board, and
in a state in which at least one projecting portion formed in a projecting manner in the shield case is inserted into the at least one through hole, electrically connecting the projecting portion to the ground layer via solder,
wherein the printed circuit board comprises a front-side ground layer that has conductivity and is different from the ground layer, wherein the front-side ground layer is provided on the one side,
the projecting portion is electrically connected to the front-side ground layer via the solder,
the printed circuit board comprises a connecting portion that has conductivity, wherein the connecting portion is provided in an inner peripheral portion of the through hole and electrically connects the at least one ground layer and the front-side ground layer to each other, and
the projecting portion is electrically connected to the connecting portion via the solder.

* * * * *